United States Patent [19]

Lloyd et al.

[11] 4,042,939
[45] Aug. 16, 1977

[54] PRINTER/PLOTTER STYLE SYSTEM FOR CONFINED INSTALLATION AND METHOD

[75] Inventors: William A. Lloyd, San Jose; Salvatore Barone, Boulder Creek; Gerald E. Hooper, Los Altos Hills; Keith E. McFarland, Woodside, all of Calif.

[73] Assignee: Xerox Corporation, Stamford, Conn.

[21] Appl. No.: 612,689

[22] Filed: Sept. 12, 1975

[51] Int. Cl.² .................. G01D 15/28; G03G 15/00
[52] U.S. Cl. ............................. 346/153; 156/257; 220/4 R; 346/145; 220/4 F
[58] Field of Search ............ 346/153, 165, 162, 150, 346/145, 24; 156/257; 220/4 R, 4 F

[56] References Cited

U.S. PATENT DOCUMENTS

| 3,644,930 | 2/1972 | Stange | 346/74 ES |
| 3,673,600 | 6/1972 | Damouth | 346/74 ES |
| 3,724,702 | 4/1973 | Kay | 220/4 F |
| 3,725,950 | 4/1973 | Lamb | 346/74 ES |
| 3,896,451 | 7/1975 | Omi | 346/74 ES |
| 3,974,934 | 8/1976 | Rohner | 220/4 F |

Primary Examiner—Jay P. Lucas
Attorney, Agent, or Firm—M. J. Colitz; T. J. Anderson; L. Zalman

[57] ABSTRACT

Recording machine such as electrostatic printer/plotter or facsimile plotter includes housing construction and associated operating components whereby overall external width reduction is accomplished without loss of function using liftable lid and method of cross-bracing. Machine serviceable through removable bottom closure panel supporting an electronic chassis. Operating stations, such as recording assembly including both electrostatic latent image recording station and a toner developing station, and web-cutting assembly each includes portions in both lid and base of housing to be yieldingly held together in cooperating relation by hinged latching panel in which the hinge pin supplies spring action to urge and retain the latching panel in its detented position.

17 Claims, 21 Drawing Figures

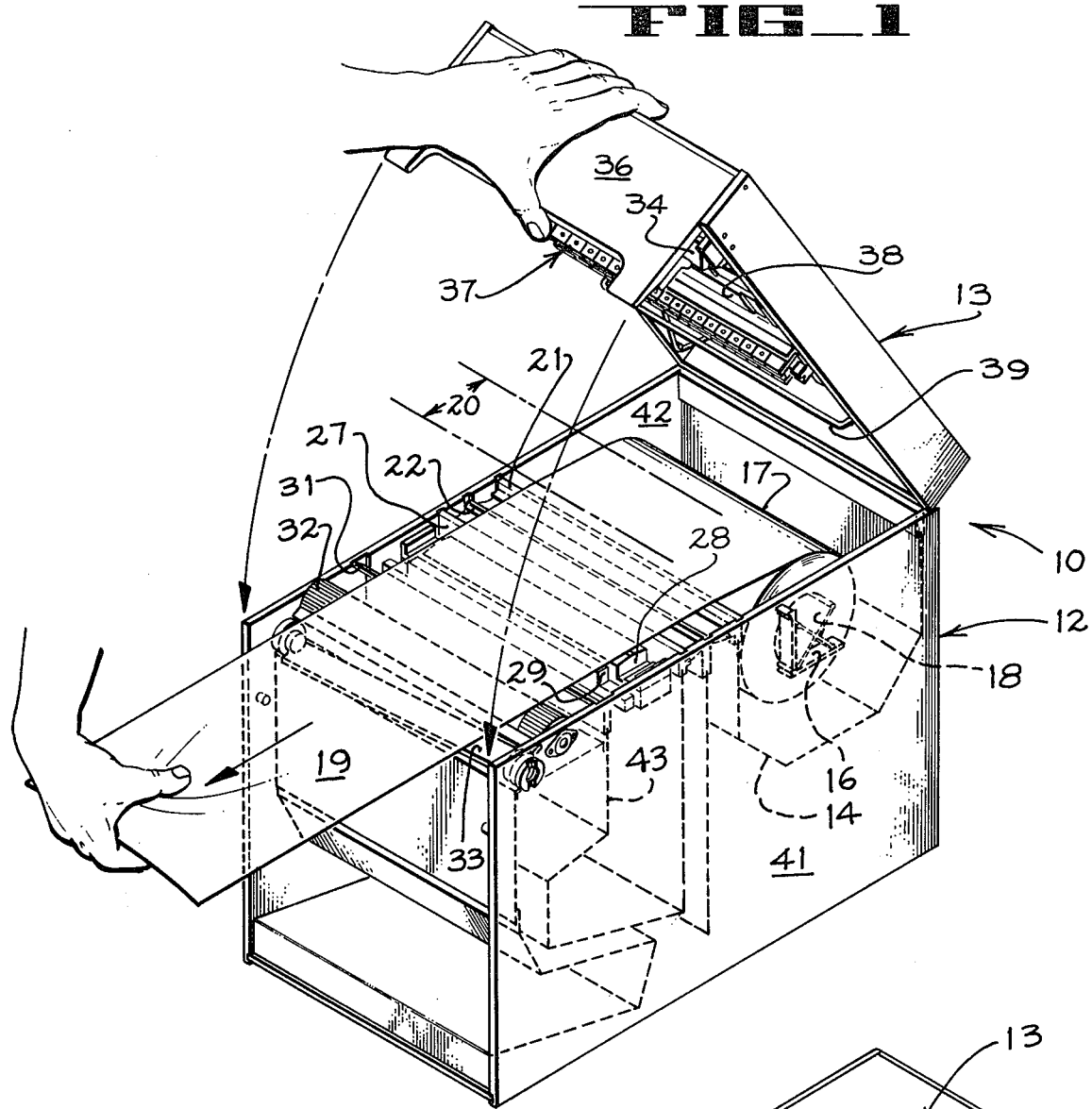
FIG_1
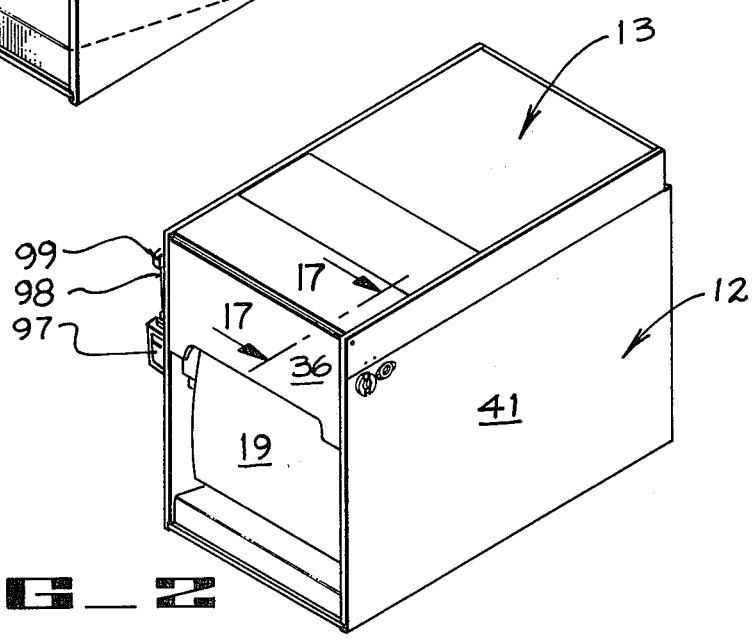
FIG_2

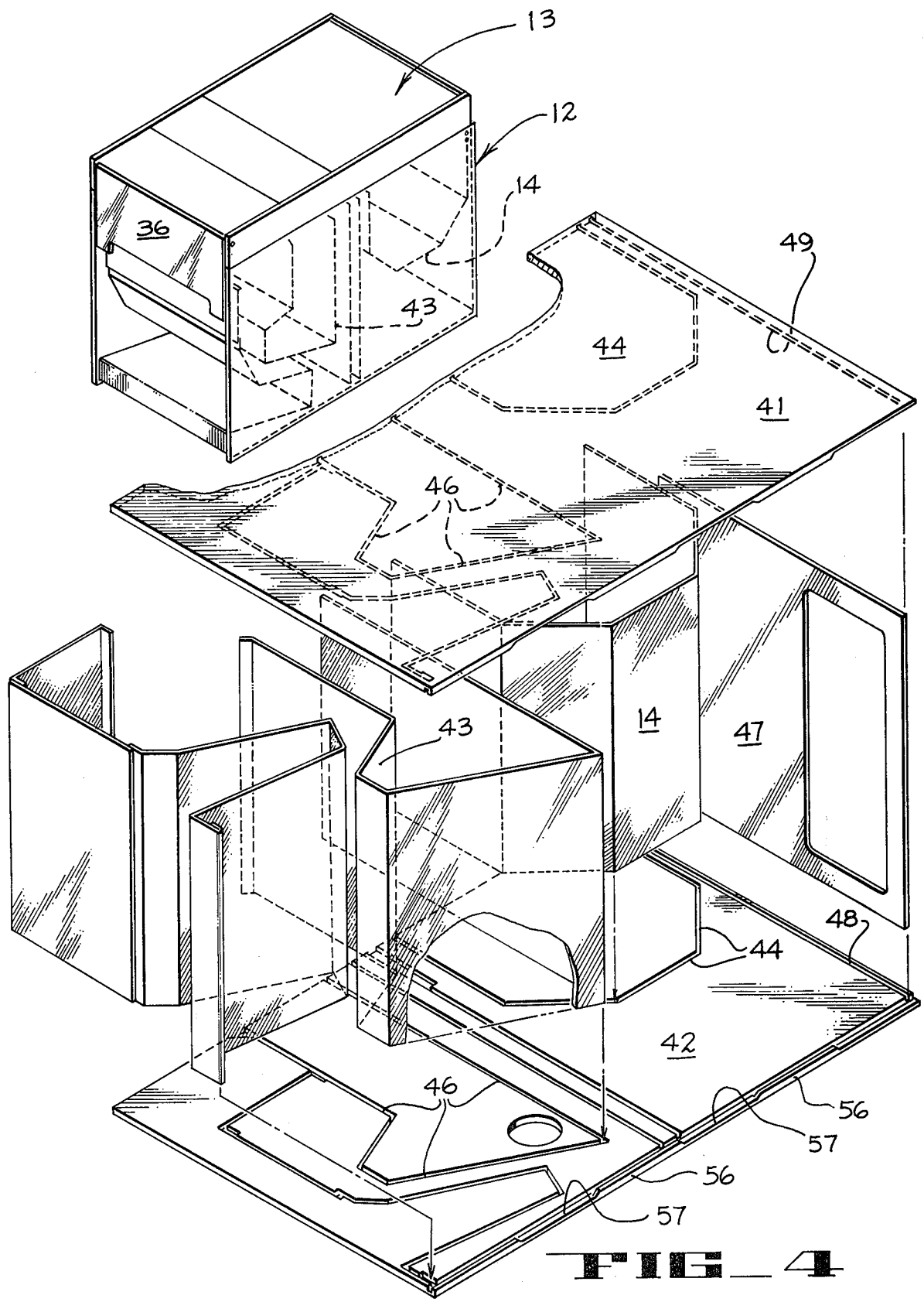

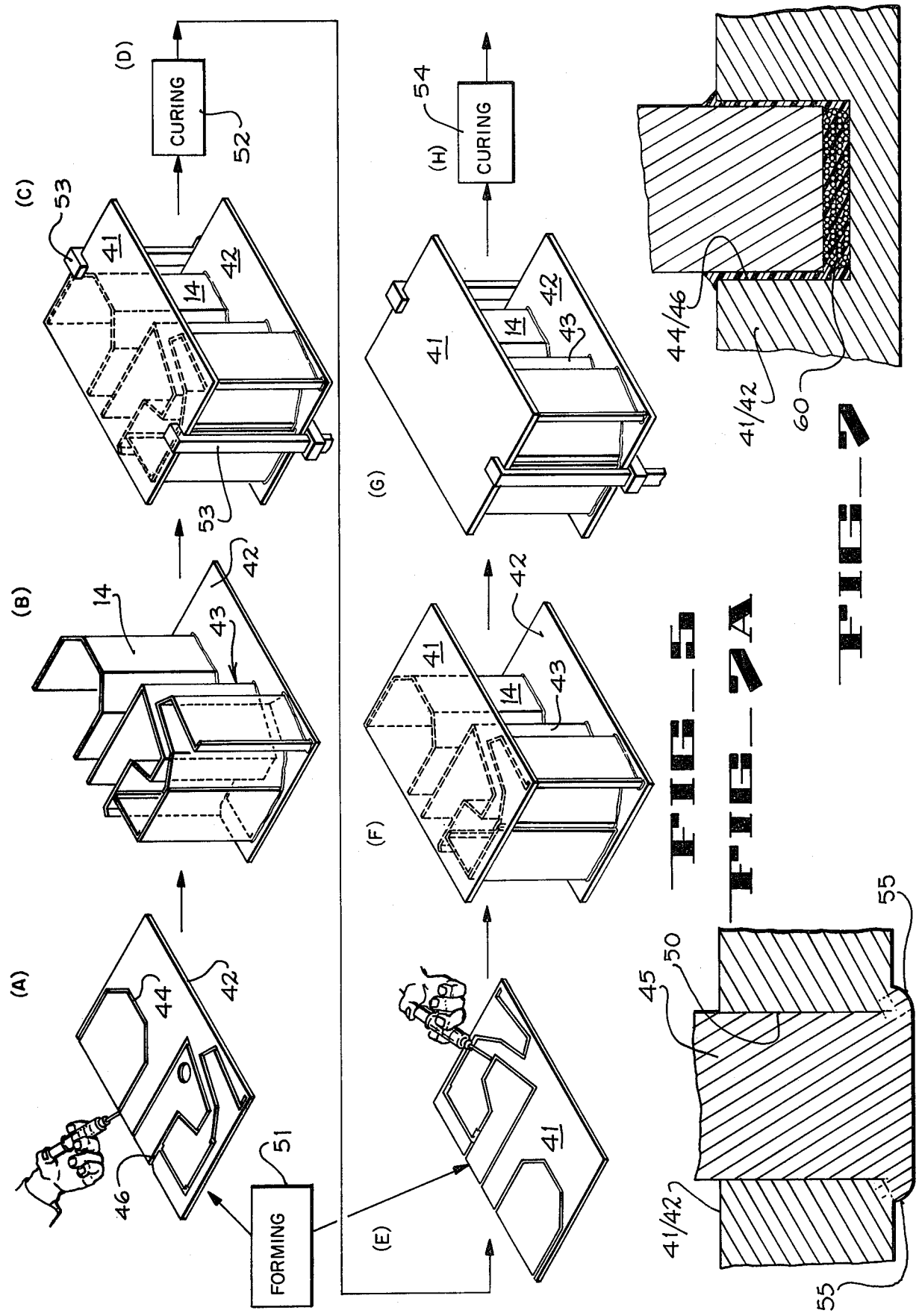

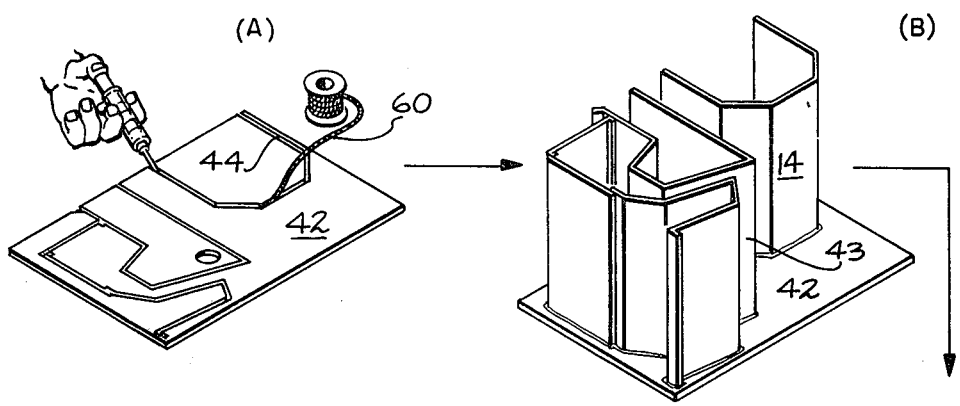
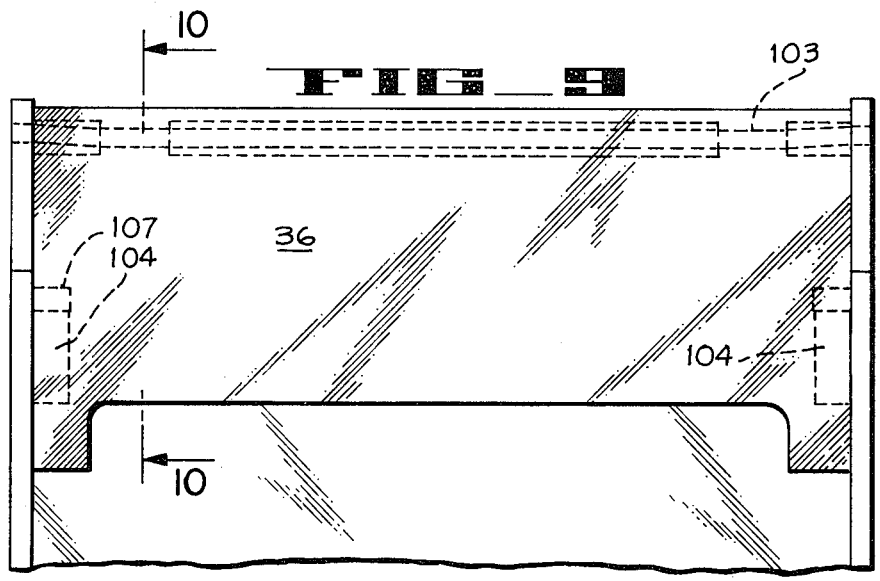
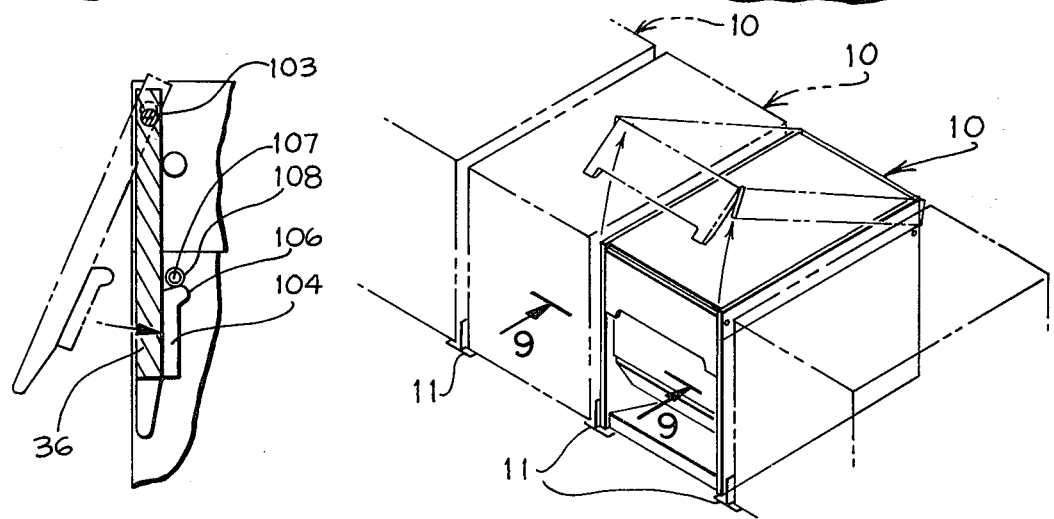

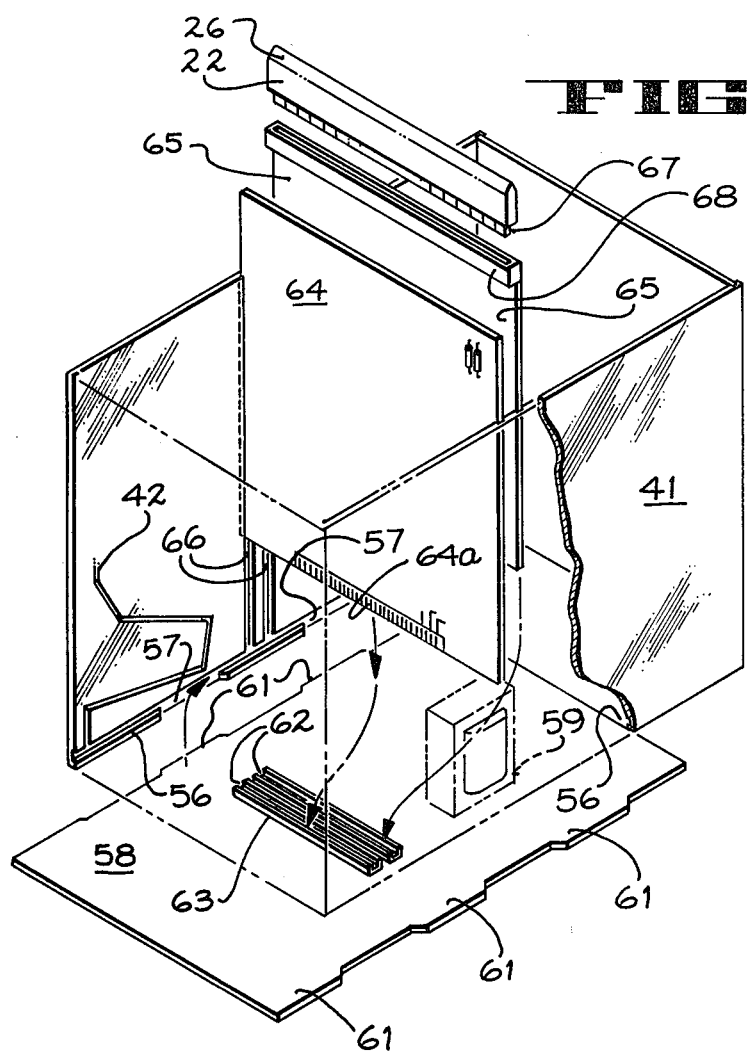
FIG_11
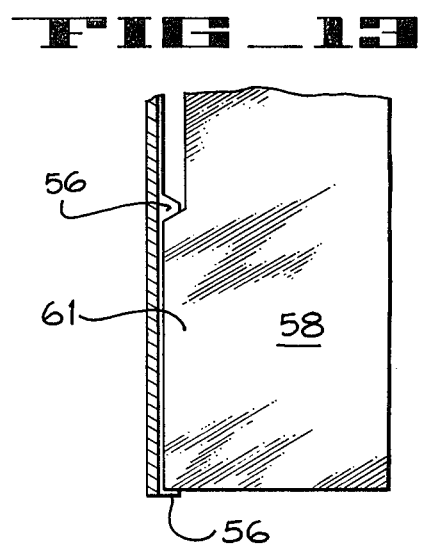
FIG_13
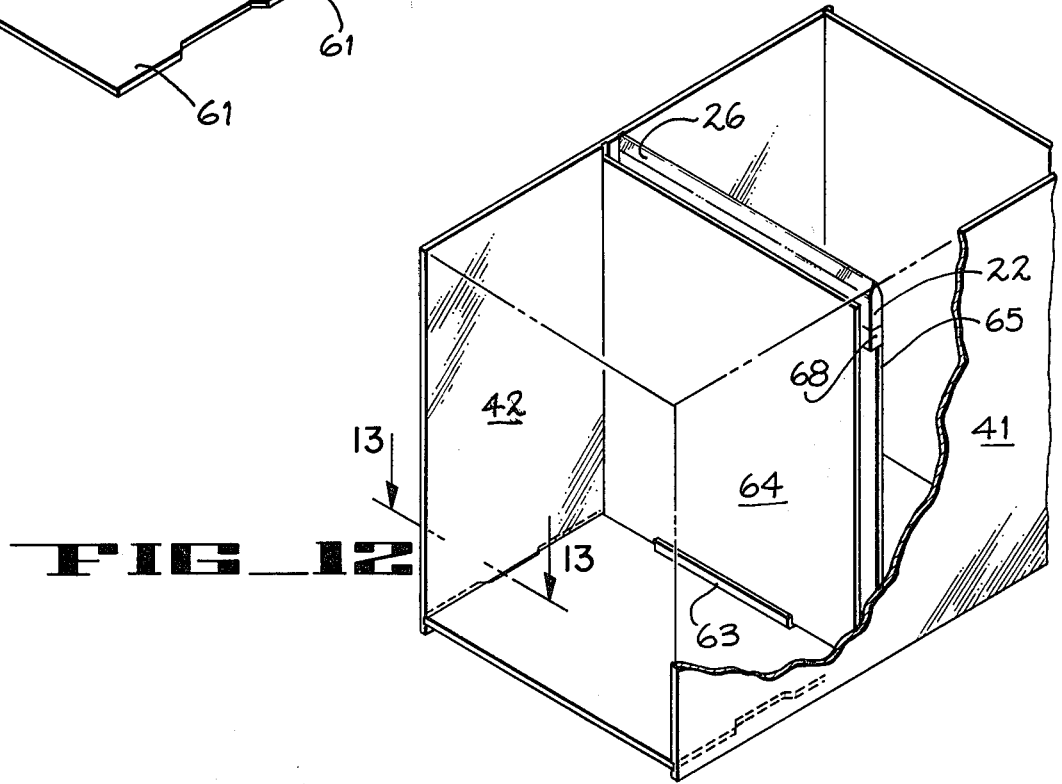
FIG_12

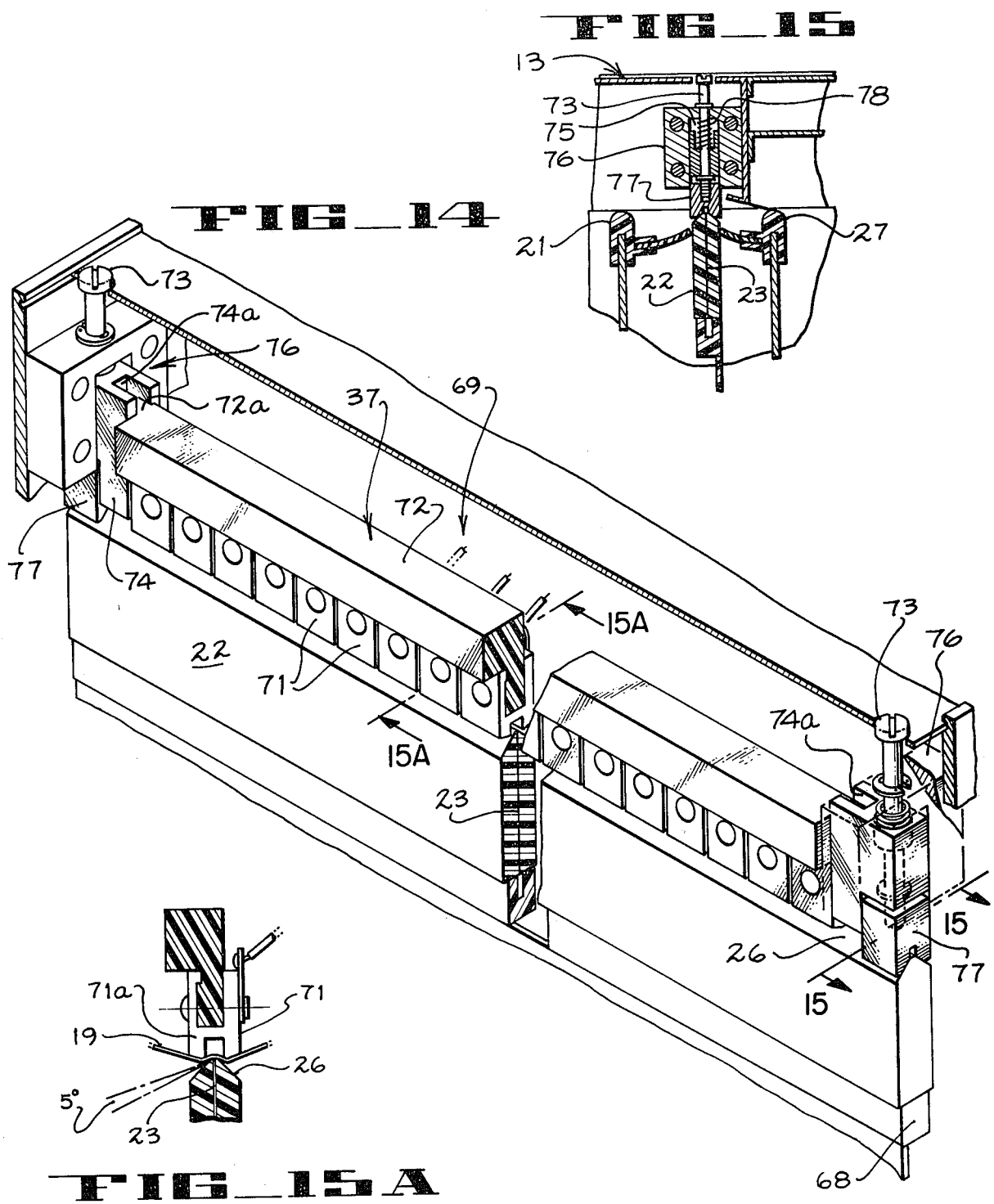

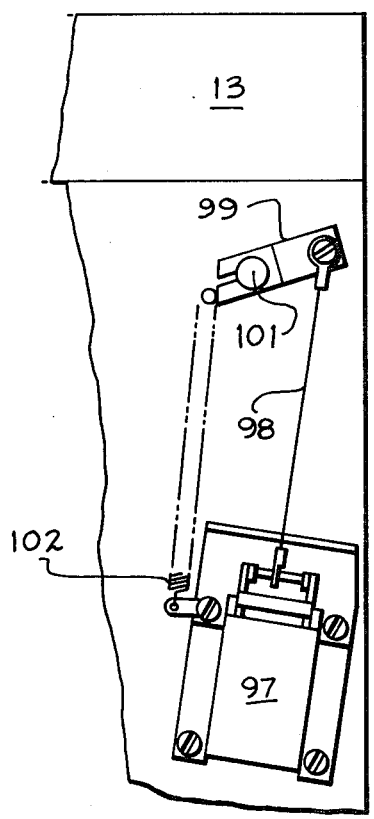
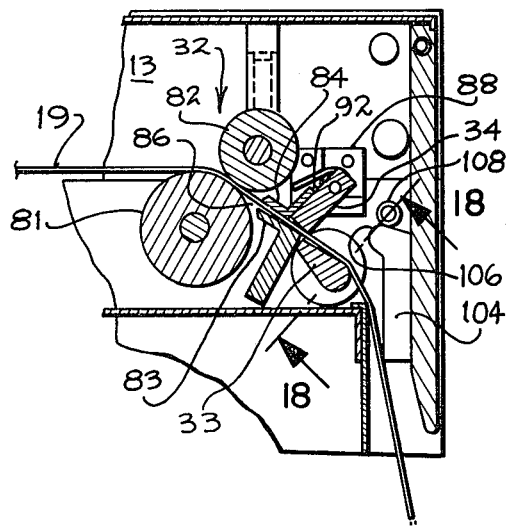
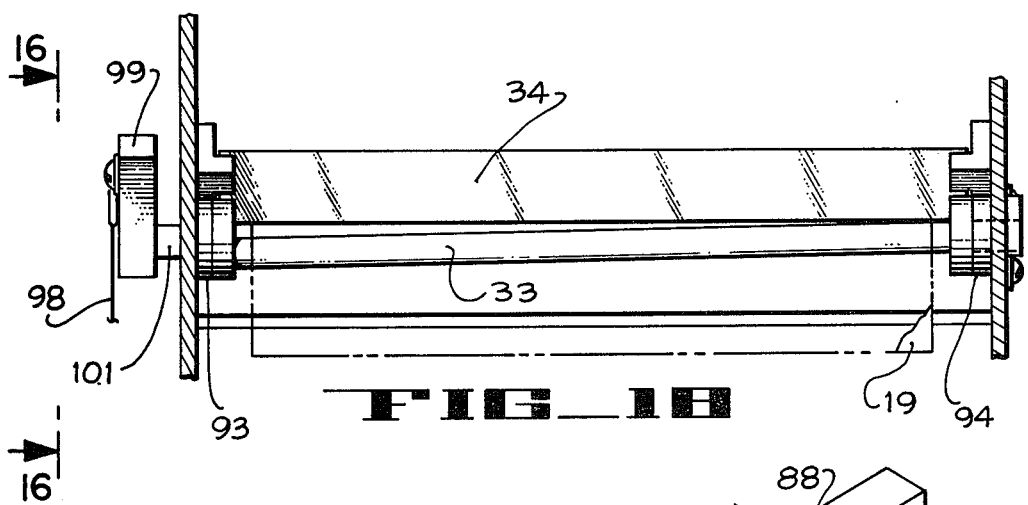
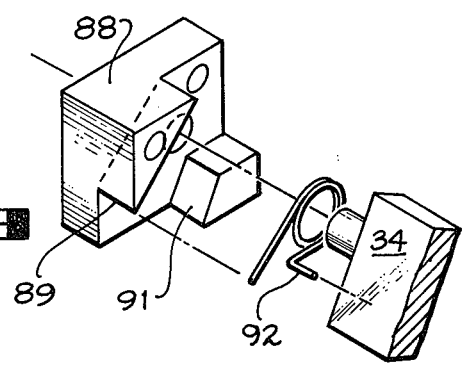

PRINTER/PLOTTER STYLE SYSTEM FOR CONFINED INSTALLATION AND METHOD

BACKGROUND OF THE INVENTION

This invention pertains to recording systems of the type known as printer/plotters or facsimile plotters characterized by a web of recording paper or other material arranged to travel a predetermined path including recording means for recording information on the web. This invention more particularly applies to such systems of the foregoing type constructed and arranged for performing in crowded confines as well as to a method for making such apparatus.

Recorders of the above type typically are required to be mounted in closely adjacent side-by-side relation to each other in groups carried by supporting racks or frames. Thus, loading, use, servicing and maintenance of the machines becomes difficult.

In addition, notwithstanding the fact that these machines may be mounted in a crowded arrangement, it is nevertheless desirous to maintain as many of the features of machines which are not so handicapped. For example, it is desirous to permit the system to employ standard web widths of recording paper, to be capable of being easily serviced in regard to the electronic and mechanical components, etc.

Accordingly, the objective herein has been to build an electrostatic printer/plotter, facsimile plotter or similar machine arranged in a manner to include all the desirable features of easy loading and threading of paper; readily accessible and serviceable electronic chassis and components; and a self-aligning paper cutter having electrically controlled means to cut the printed paper output of the recorder at desired lengths; and wherein all of the foregoing may be provided with relatively simple threading to dispose the web to pass between cooperating portions of various stations in the apparatus while being suitable for mounting in the narrow confines of the usual racks which carry printer/plotters and facsimile plotters.

Accordingly, a suitable method of constructing the recorder with a very narrow front elevation while not sacrificing its capability for handling standard widths of recording paper has been provided. In addition, the housing construction is formed in a manner whereby the electronic chassis and components are readily accessible and serviceable notwithstanding the fact that the apparatus may be mounted in a closely disposed side-by-side relation to other such systems.

In addition to the above, there have been disclosed herein other additional features and advantages described further below.

SUMMARY OF THE INVENTION AND OBJECTS

In general, a system of the kind described has been provided comprising a housing having spaced confronting side walls and in a component functioning in the system extends between the confronting surfaces of the side walls to provide cross-bracing strength to the housing. The confronting surfaces include slots formed therein in a configuration serving to receive end portions of the component functioning in the system. The end portions of the component are affixed by suitable means in the slots so as to employ that component additionally as cross-bracing for the housing as well as to be employed for its own function.

There is also provided a method of so constructing the aforementioned housing.

In addition to the above and as disclosed herein, improved means for supporting and readily releasing the electronic chassis of the apparatus from below comprises elongate rails carried at the lower end edge margin of the confronting side walls and a bottom closure panel including laterally extending tabs carried at the side edges adapted to pass upwardly with the panel through gaps formed in the rails whereby subsequently the bottom closure panel can be moved along the direction of the rails to cause the tabs to be disposed onto the rails in supporting relation.

The bottom closure panel is locked from being inadvertently released by means of an interlock whereby a movable element engages an opening carried by the closure panel.

In addition to the above, the system includes an improved means for cutting the web into predetermined lengths as desired as well as an improved self-aligning recording head comprised of a line of pin-like nibs to cooperate with the web passing across the nibs. As disclosed further below, it will be readily evident that the recording station, the web-cutting station and the paper-driving station are all arranged to include portions disposed in both the movable lid and in the stationary base of the housing. Accordingly, the mutually cooperating portions of each station must be properly disposed with respect to each other and means have been provided for making such mutual accommodation in all instances.

In general, it is an object of the present invention to provide an improved electrostatic recording system of the type employed in printer/plotters and facsimile plotters and which overcomes the above and other problems.

Another object of the invention is to provide a narrowed recorder housing without reducing the width of web employed in the system and a method for making such housing.

Another object of the invention is to provide a recorder arranged to be serviced in situ while mounted in substantially contiguous, side-by-side relation to other recorders or the like.

A further object of the invention is to provide a system of the kind described in which the housing includes a lid carrying portions of the stations so that the web can be merely withdrawn and laid across those portions of each station remaining in the stationary base portion of the housing and the lid thereafter closed to accomplish "threading" of the web without having to feed the leading end edge of the web between the cooperating parts of each station.

It is yet another object of the invention to provide a readily threaded system in which the web passes between opposed cooperating parts.

An additional object of the invention is to provide an improved self-aligning web-cutting device having a portion carried in the lid and another portion carried in the base of the housing.

Yet an additional object of the invention is to provide, according to one embodiment, means electrically coupling the internal components of the system to the confronting side walls so as to eliminate radio frequency interference or electromagnetic interference to electrically isolate the components of the recorder.

The foregoing and other objects of the invention will become more evident from the following detailed description of preferred embodiments.

BRIEF DESCRIPTION OF THE DRAWINGS

FIG. 1 shows a diagrammatic perspective view of a recorder system according to the invention with a web being loaded into position;

FIG. 2 shows a diagrammatic perspective view of FIG. 1 in reduced scale with the lid of the housing in its closed position;

FIG. 3 shows a diagrammatic perspective view of the housing of the invention with portions shown in dotted lines for clarity in associating FIG. 3 with FIG. 4;

FIG. 4 shows an enlarged scale an exploded perspective view of the housing shown in FIG. 3;

FIG. 5 shows in diagrammatic form the steps of a method employed in constructing a housing according to the invention;

FIG. 6 shows a perspective diagrammatic view of a step employed in another embodiment of the method shown in FIG. 5;

FIG. 7 shows in enlarged detail a section view of a portion of the assembly shown in FIG. 6;

FIG. 7A shows an enlarged detail in section showing another means for attaching the end edge margins of components to side wall panels 41, 42;

FIG. 8 shows a diagrammatic perspective view of a group of electrostatic recorders of the kind described disposed in rack-mounted arrangement;

FIG. 9 shows a front elevation view of detail of the apparatus shown in FIG. 8 taken along the line 9—9 thereof;

FIG. 10 shows a side elevation section view taken along the line 10—10 of FIG. 9;

FIG. 11 shows an exploded perspective view with portions broken away of a readily removable chassis and bottom closure panel construction according to the invention;

FIG. 12 shows a diagrammatic perspective view with portions broken away for clarity of the structure shown in FIG. 11 in assembled condition;

FIG. 13 shows in plan view an enlarged detail taken along the line 13—13 of FIG. 12;

FIG. 14 shows in enlarged detail a perspective view with portions broken away for clarity of a self-adjusting back plate electrode assembly as carried in the lid of the housing according to the invention;

FIG. 15 shows an elevation section view of an enlarged detail of FIG. 14 taken along the line 15—15 thereof;

FIG. 15A shows an elevation section view in enlarged detail and taken along the line 15A—15A of FIG. 14;

FIG. 16 shows an enlarged side elevation view of a detail shown partially in FIG. 2;

FIG. 17 shows an enlarged side elevation section view of a cutting mechanism for selectively cutting a web of paper into predetermined lengths as mounted in the forefront of the lid and body of the housing;

FIG. 18 shows an enlarged elevational section view of a cutting blade assembly according to the invention;

FIG. 19 shows a diagrammatic perspective view of an enlarged detail employed in the cutter mechanism shown in FIG. 17.

DETAILED DESCRIPTION OF PREFERRED EMBODIMENTS

An electrostatic recording machine 10 or system of the kind described is shown generally in FIG. 1 wherein portions of a number of stations are disposed above and below a web 19 of recording paper or other material.

Briefly, as noted in FIG. 8, machines 10 may frequently be mounted in stationary racks 11 whereby access for servicing and the like is not particularly convenient. However, according to the disclosure herein, an electrostatic recording system 10 has been provided in which a housing including a base portion 12 and a lid portion 13 are provided as explained in greater detail below.

Generally, as disclosed in FIG. 1, a receptacle or bin 14 formed at its ends with roll-support brackets 16 mounted to the interior sides of base 12 receives a roll 17 of recording paper mounted upon an X-shaped hub 18 carried by brackets 16. In this way, the paper from roll 17 can be withdrawn as shown in FIG. 1 to form the web 19 lying across those components yet to be described which are carried in the base portion of the housing.

Bin 14 hermetically seals rolls 17 from the atmosphere. Thus, immediately downstream of roll 17, web 19 engages a seal 21 carried on an upper edge of bin 14. Web 19 then passes across an electrostatic recording head 22 comprised generally of an elongate member 24 having a generally planar configuration. Member 24 is disposed to extend transversely of web 19 and is formed at its distal end edge (its upper end edge at this point) to define an elongate tapered edge or ridge 26. A line of pin-like recording nibs 23 (FIGS. 14, 15 and 15A) lies exposed at the apex of ridge 26 in recording relation to web 19 as web 19 passes across as described further below.

Subsequently, web 19 passes across another seal 27 and then across a toner fountain 28 of a type adapted to develop the recorded latent electrostatic manifestations applied to web 19 by means of head 22.

Web 19 then passes across a vacuum operated toner removing bar 29 of known construction and then across another seal 31 to engage a differential drive roller assembly 32 also of known construction in which a differential drive mechanism is employed to insure that web 19 advances in a straight line.

At this point, web 19 passes between opposed cutting blades of a cutting assembly as described further below but which includes a selectively rotatable cutting blade 33 and an upper cutting blade 34.

With lid 13 in its down and closed position, the outer end of web 19 will be directed downwardly and rearwardly by the natural curvature of the paper and latch panel 36 carried to depend from lid 13.

Lid 13 carries portions of some of the stations referred to above so that upon closure of lid 13, web 19 becomes properly embraced between cooperating portions of each station appropriately aligned and disposed. Thus, for example, back plate electrode assembly 37 as described further below depends downwardly from lid 13 to straddle ridge 26 of head 22.

As noted above, half of the cutting mechanism is located in lid 13. In addition, a back rest 38 carried by lid 13 is disposed to overlie and engage web 19 in the region directly above toner fountain 28 for properly positioning web 19 relative to fountain 28.

A so-called "de-reeler" bar 39 comprises a resilient rod or bar 39 of known design carried within lid 13 to engage web 19 and un-roll or "de-roll" a short length of web 19 from roll 17 upon closure of lid 13. In this manner, web 19 can be accelerated quickly without having to acclerate the entire mass of roll 17. The resilience of bar 39 lying against web 19 in the region 20 thereof constitutes a means for interposing a slack length of web 19 between roll 17 and the drive roller assembly 32 simply by pushing down on the region 20 while the leading end of web 19 is held by the stations acting thereon while roll 17 is free to rotate.

Having the foregoing in mind and with reference to FIGS. 2, 3 and 4, the base portion 12 of the housing comprises spaced confronting side walls 41, 42. In lieu of employing separate cross-bracing to space walls 41, 42, means functioning in the system as a component part of the system have been employed which extend between the confronting surfaces of side walls 41, 42 such as the toner reservoir 43 and bin 14. The confronting surfaces of side walls 41, 42 include slots 44, 46 formed therein in a configuration serving to receive end portions of at least one of the functional means, such as bin 14 or toner reservoir 43. Reservoir 43 and bin 14 are fixed into slots 44, 46 by suitable means, such as by epoxy or other material or other means suitable for providing an appropriate bond.

FIG. 7A shows an end edge margin portion 45 of a component such as reservoir 43 or bin 14 attached to one of walls 41, 42 by forming a slot 50 to extend completely through wall 41, 42. Then the protruding portion is welded to form a bead 55 of weld serving to lock the component to an associated one of walls 41, 42.

An advantage of this method resides in the fact that excellent electrical coupling occurs between the components and the housing so as to isolate them from radio frequency interference and electromagnetic interference (RFI and EMI).

As shown in FIGS. 6 and 7, a means and step in the method which can be introduced to obtain protection against RFI and EMI transmissions using epoxy material for the bond is shown. A woven cord 60 of copper wire or other conductive wire "mesh" or "wool" is first laid in slots 44, 46 and then the epoxy is applied as above described.

In some instances conductive epoxy or other bonding material may be used. The conductive epoxy comprises an epoxy material laced with particles, such as of silver or other conductor.

A partial back wall 47 engages a groove 48 in side wall 42 and a groove 49 in side wall 41 and is suitably affixed between side walls 41, 42 by the method now to be described.

Toner reservoir 43 contributes to the system by supplying toner to toner fountain 28. Similarly, bin 14 consitutes a functional component of the system in view of the fact that it hermetically seals the roll 17 of paper from the atmosphere. Accordingly, these participating components, as arranged above, contribute cross-bracing strength to housing 12 in addition to their usual functions. Thus, cross-bracing strength is provided by participating components of the system.

As shown in FIG. 5, a method of forming the base 12 of the housing as described in which cross-bracing strength is derived from a component already providing a function in the system. The method includes the steps of forming first and second side wall panels 41, 42 as diagrammatically represented by box 51. It is to be understood that panels 41, 42 can be formed by routing or molding slots 44, 46 or by any other suitable means for forming appropriate slots to receive the end edges of the components.

The next step (FIG. 5A) is to apply a binding material, such as epoxy, along slots 44, 46 and others as formed in the surface of a first wall panel, such as panel 42 wherein the slots are formed in the configuration of an end of the component or components, such as toner reservoir 43 or bin 14. The next step is to seat an end of the associated component into its respective slots and into the binding material located therein. This stage is shown in FIG. 5B. The next step includes disposing onto the other end of the component or components 14, 43, etc. the other wall panel 41 having slots formed therein defining the configuration of the other end of the component or components. In this manner, the top panel 41 serves to act as a template in guiding and retaining the assembled structure as it is delivered into a curing oven or as it is otherwise cured. For this purpose, a clamp means 53 holds the two confronting side wall panels 41, 42 against the opposite ends of components lodged in the slots thereof. Thus, the wall panels are urged together to retain components 14, 43 therebetween while curing is effected at the stage identified by the box numbered 52 whereby the attaching material after curing fixes only the first named end of the components in their associated slots.

The next step is to apply a binding material along the slots of the second wall panel 41 followed by urging the two wall panels together as above while curing the last name application of binding material so as to fix the second wall panel to the other end of component 14 and/or 43, etc. in associated slots. Ultimately, after curing (as represented by box 54), the urging applied by clamps 53 is discontinued to permit components 14 and/or 43 to provide cross-bracing strength to housing base 12.

From the foregoing, it will be readily evident that there has been shown a method for forming the base portion of a housing for a system of the kind described and in which cross-bracing strength is derived from a component providing a function of the system wherein the method includes the steps of forming first and second side wall panels to include slots therein defining the configuration of the opposite ends respectively of a functional component of the system.

The next step includes disposing one end of the component into its associated slot of a first panel followed by fixing the one end of the component into the slots of the first panel while disposing the other end of the component into the slots of the second panel to permit the second panel to serve as a retaining template on the other end of the component during fixing thereof. The further step is accomplished then of fixing the other end of the component into the slots of the second panel whereby the component provides cross-bracing strength between the two panels affixed thereto.

According to the construction of machine 10 as shown best in FIGS. 11, 12 and 13, means are provided whereby servicing of the electronic chassis and other interior components is readily handled as now to be described.

Support rails 56 formed along the lower edge margin on each of the confronting side walls are interrupted by gaps 57 therein. A bottom closure panel 58 serving as a supporting chassis for electronic and electrical apparatus employed in machine 10 as represented schematically by the transformer power supply 59 includes laterally extending tabs 61 integral with panel 58 so that they move with panel 58 upwardly through gaps 57 whereby after panel 58 has been lifted to a level above rails 56, movement of panel 58 lengthwise of rails 56 disposes tabs 61 in position to rest upon the rails to support panel 58 therefrom (FIGS. 12, 13).

Means are provided for retaining bottom closure panel 58 in a predetermined longitudinally disposed position so as to guard against inadvertent removal of the bottom panel 58 from the machine. Accordingly, panel 58 is arranged to include transversely extending openings in the form of grooves 62 formed in transversely open P.C. board connectors 63 adapted to receive the ends 64a of conductors applied to printed circuit boards or substrates 64, 65 respectively providing logic and nib driving circuitry.

Substrates 64, 65 slide in grooves 66 formed in walls 41, 42 to move between raised and lowered positions. In their lowered position, substrates 64, 65 engage the transverse groove 62 of connectors 63 to provide electrical coupling therethrough to conductors such as 64a. As thus assembled, it will be readily evident that closure panel 58 is locked from being moved longitudinally by virtue of the inter-engagement of the lower end edge of either of printed circuit boards 64, 65 with their respective connector 63.

Thus, in order to remove closure panel 58, it is only necessary to lift the P.C. boards 64, 65 upwardly out of engagement with their respective connectors 63 to permit panel 58 to be moved forwardly until tabs 61 become aligned with gaps 57 thereby permitting the entire chassis of the machine to be dropped downwardly out of the machine for servicing.

Head 22 includes a ridge 26 along its upper end edge. Along its bottom edge electrical coupling means 67 are adapted to be inserted into and be engaged by an open connector 68 of substrate 65.

Printed circuit panels 64, 65 each carry electrically conductive means disposed to extend between head 22 and the lower end edge margin 64a so that the elongate open connectors 63 formed with grooves 62 provide a suitable stop means to engage the lower end edge of each of panels 64, 65 thereby also forming an electrical connection with head 22.

Means for electrostatically recording on web 19 is best shown in FIGS. 14, 15 and 15A wherein portions of the recording means are carried by lid 13 and by the base 12 of the housing. Accordingly, and in general, recording nibs 23 are carried in head 22 to be disposed to be brought into cooperative relation with web 19 upon closure of lid 13 so that closing the lid disposes web 19 in a threaded relation between both the bottom and top portions of the recording means.

Thus, a recording head assembly 69 includes both the transversely extending head member 22 containing nibs 23 and terminating at its upper end edge with ridge 26 and a self-adjusting back plate assembly 37 in which a series of segmental electrode elements 71 of known type are carried by an insulated cross member 72 which, in turn, is arranged to be adjustably positioned independently at its ends by means of the adjusting screws 73.

Inverted L-shaped brackets 74 are formed to include a slot 74a therein to receive the tongue-like ends 72a of cross-member 72. Inverted U-shaped brackets 76 mounted to the interior surfaces of walls 41, 42 form a slot 75 for receiving brackets 74 to ride therealong.

Means for adjusting each end independently of the other includes screws 73 which extend freely through the transverse portion of inverted L-shaped brackets 74 to be threaded into a mounting shoe 77. Shoe 77 includes at its lower end an inverted V-shaped surface adapted to cooperate with and to seat upon ridge 26 of head 22. Mounting shoes 77 are also disposed partially within slot 75. A spring 78, disposed about the shank of screws 73 and interposed between the transverse member 76a of bracket 76 and the upper end of bracket 74, absorbs any shock which may be incurred upon closure of lid 13 in the event of improper adjustment of screws 73.

In addition, each spring 78 serves to apply a limited bias force to assembly 37 urging it downwardly against web 19 as web 19 passes between electrode elements 71 and the top of ridge 26.

Each electrode element 71 (FIG. 15A) includes a bottom configuration in the form of an inverted U-shaped configuration in which the tips 71a of the U-shaped configuration are tapered and spaced apart so as to permit web 19 to move into and out of the interface between ridge 26 and element 71 at an angle preferably on the order of 5°. It has been observed that providing this amount of indentation in a path of this nature provides improved recording.

As shown in FIGS. 16, 17, 18 and 19, means are provided for cutting web 19 into predetermined lengths as the web departs from the machine. The web-cutting assembly 79 includes portions carried both in the lid 13 and in base 12. Differential drive assembly 32 lies immediately associated with web-cutting assembly 79. Assembly 32 includes a pair of rollers 81, 82 forming a nip therebetween after closing lid 13. Web 19 passes through the nip defined by rollers 81, 82 and through a guide slot 86 defined between angle members 83, 84. Angle member 83 is mounted in a fixed position between side walls 41, 42 while angle member 84 is attached to the upstream side of an upper cutting blade 87. The ends of blade 87 are mounted in a pair of limiting brackets 88 formed with upper and lower stop portions 89, 91. A spring 92 engages blade 87 to urge it downwardly toward stop portion 91 as well as toward the bosses 93, 94 disposed at opposite ends on a movable cutter blade 33. Thus, upper blade 87 will be used into bosses 93, 94 on the circumference of the arc traced by the edge of blade 33. Blade 33 disposed at an angle to the horizontal cuts progressively from one end to the other as it is rotated. After having severed the paper, the remaining tip end of web 19 is retained in guide slot 86 so as to be ready to advance without re-threading.

Means for selectively rotating lower cutter blade 33 includes the solenoid 97 coupled by means of a cable 98 to a lever arm 99 mounted onto the protruding stub end 101 of movable cutter blade assembly comprised of bosses 93, 94 and blade 33. A spring or other biasing means 102 serves to bias blade 33 to a downward position so as to retract blade 33 after each activation of solenoid 97.

Accordingly, the web-cutting means disclosed above includes portions carried by both lid 13 and base 12 of the housing. By lifting lid 13, web 19 may be withdrawn from its supply located in bin 14 and overlaid across the lower cutting blade carried by base 12 of the housing. Subsequently, both portions of the cutting assembly are disposed to be brought into cooperative relation embracing web 19 therebetween simply by closure of lid 13 which thereby very simply threads web 19 between the two portions of the cutting means.

As shown best in FIGS. 8, 9 and 10, means are provided for yieldingly retaining lid 13 in its closed position. Accordingly, a flexible pivot rod or hinge pin 103 extending across the path of web 19 is carried by the sides of lid 13. A pivotable member, such as the latch panel 36, carried on hinge pin 103 depends downwardly from lid 13. Panel 36 is movable between advanced and retracted positions toward and away from housing 12 for inter-connecting detent means having a first portion carried on panel 36 and a second portion carried on the side walls 41, 42 of housing 12.

Engagement occurs upon movement of panel 36 between the walls 41, 42. Accordingly, as shown best in FIG. 10, the detent portion carried on panel 36 includes a cam element 104 formed at its upper end with a rounded camming surface 106. Camming elements 104 are disposed at the side edge margins of panel 36 and at an elevation adapted to engage the inwardly protruding studs 107 formed to carry a rotary bearing sleeve 108 thereon.

Upon closure of door 36 to the detected position shown in FIG. 10 in full lines, hinge pin 103 will be caused to be drawn downwardly slightly as shown in FIG. 9 so as to provide the dual functions of a hinge and of spring force applied to maintain the detented condition of elements 104 with studs 107. Thus, as they are urged together by the urging of hinge rod 103, the pivotable member or panel 36 is drawn downwardly against the resilience of hinge rod 103 so that rod 103 yieldingly retains the two portions in mutual engagement.

From the foregoing, it will be readily evident that there has been provided an improved electrostatic recording machine of a type used typically for printer/plotter applications or facsimile plotting applications and which is capable of being mounted in the narrow confines of the usual rack-mounted arrangement without sacrificing features of machines of the same type not required to be so closely mounted together.

What is claimed is:

1. In a recorder system of the kind wherein a plurality of component parts are employed to produce information on a record material and including an elongate web of record material to be moved along a predetermined path, the combination comprising a housing having spaced confronting side walls, means functioning in the system as a component part of the system and extending between the confronting surfaces of said side walls, the confronting surfaces including slots formed therein in a configuration serving to receive therein end portions of said functioning means, means for affixing said end portions in said slot to employ said functioning means additionally as cross-bracing between said confronting walls of said housing, and means for forming a direct electric coupling between said walls and said component part to minimize generation of radio frequency interference and electromagnetic interference externally of said housing.

2. In a system according to claim 1 wherein said slots have openings to permit said end portions to protrude therethrough and said side walls comprise metal, said affixing and forming means comprising a weld whereby the protruding portions of said end portions are welded to merge with the metal of said side walls.

3. In a system of the kind described employing an elongate web of record material to be moved along a predetermined path, the combination comprising a housing having spaced confronting side walls, means functioning in the system and extending between the confronting surfaces of said side walls, the confronting surfaces including slots formed therein in a configuration serving to receive therein end portions of said means, means serving to affix said end portions in said slots to employ said functioning means additionally as cross-bracing between said confronting walls of said housing, and a length of woven wire disposed in said slots in contact with said end portions to form a direct electric coupling between said walls and said component to minimize generation of radio frequency interference and electromagnetic radiation externally of said housing.

4. In a recorder system of the kind wherein a plurality of component parts are employed to provide information on a record material and including an elongate web of record material to be moved along a predetermined path the combination comprising a housing having spaced confronting side walls, means functioning in the system as a component part of the system and extending between the confronting surfaces of said side walls, the confronting surfaces including slots formed therein in a configuration serving to receive therein end portions of said functioning means, means for affixing said end portions in said slots to employ said functioning means additionally as cross-bracing between said confronting walls of said housing.

5. In a system according to claim 4 in which said functioning means comprises an elongate receptacle for receiving a roll of record material therein to be dispensed therefrom, said elongate receptacle including end edges formed to be seated in said slots.

6. A system according to claim 4 in which said functioning means comprises an elongate fluid reservoir, said reservoir including end edges formed to be seated in said slots, that portion of each confronting side walls defined by an associated one of said configurations serving to define an end wall of said reservoir.

7. A system according to claim 4 comprising support rails formed along the lower edge margin on each of the confronting side walls, gaps formed in said rails, a bottom closure panel including laterally extending tabs disposed for movement with said panel upwardly through said gaps so that thereafter movement of said bottom closure panel lengthwise of said rails disposes said tabs in position to rest upon the rails to support said bottom closure panel.

8. A system according to claim 7 further comprising stop means carried by said bottom closure panel, means carried by said housing and movable between lowered and raised positions for engaging and disengaging said stop means when said bottom closure panel has been moved to a predetermined position lengthwise of said rails.

9. In a system of the kind described employing an elongate web of record material to be moved along a predetermined path, a housing comprising spaced confronting side walls, support rails formed along the lower edge margin of each of the confronting side walls, gaps formed in said rails, a bottom closure panel including laterally extending tabs disposed for movement upwardly with said bottom closure panel through said gaps so that thereafter movement of said bottom closure panel lengthwise of said rails disposes said tabs in position to rest upon the rails to support said bottom closure panel.

10. In a system of the kind described employing an elongate web of record material to be moved along a predetermined path, the combination of an electrostatic recording head to be disposed in recording relation to said web, a substrate carrying said head and extending transversely of said web, a housing containing the recording head and elongate web of record material, means for supporting said substrate to enable said substrate to move between raised and lowered positions, said housing including spaced confronting side walls, support rails formed along the lower edge margin of each of the confronting side walls, a bottom closure panel disposed to move along and to rest upon the rails to support said closure panel, and stop means carried by said closure panel for engaging the lower end of said substrate when said substrate is in the lowered position to prevent lengthwise movement of said closure panel without disengaging said substrate from said stop means.

11. A system according to claim 10 in which said stop means comprises an elongate opening carried by said closure panel at a predetermined position adapted to receive therein the lower end of said substrate.

12. A system according to claim 10 in which said substrate carries electrically conductive means disposed between said head and the lower end edge margin of said substrate, and said stop means comprises an elongate open electrical connector carried by said closure panel at a predetermined position adapted to receive therein the lower end edge margin of said substrate to form an electrical connection with said head via circuitry on said substrate while retaining said closure panel against movement.

13. In a recorder system of the kind wherein a plurality of component parts are employed to provide information on a record material and including an elongate web of record material to be moved along a predetermined path, the combination comprising a housing having spaced confronting side walls and means functioning in the system as a component part of the system and for providing cross-bracing strength between said side walls, a lid hinged to said housing and movable between raised and lowered positions with respect to the housing, recording means having portions carried by both said lid and said housing, means in said housing containing a web supply for permitting the web to be withdrawn therefrom with said lid in its raised position and overlaid across those of said portions carried by said housing, said portions being disposed to be brought into cooperative relation embracing said web therebetween upon closure of said lid, whereby closure of said lid disposes said web in threaded relation between said portions of said recording means.

14. In a system according to claim 13 in which said portions of the recording means comprise a first portion including an elongate member disposed to extend transversely of said web and formed at its distal end edge to define an elongate ridge, a line of pin-like recording nibs exposed at the apex of said ridge, a second portion including a back plate electrode assembly, said electrode assembly being disposed to extend transversely of said web and to engage said web in cooperative relation with said ridge, said electrode assembly including positioning means at each end shaped to conform to said ride to be seated thereon to dispose said back plate electrode assembly in recording relation to said web and nibs, means for indepenedently adjustably locating said positioning means to establish a predetermined spacing between said nibs and said back plate electrode assembly including shock absorbing spring means interposed between saidd positioning means and said lid to protect said nibs from damage upon closure of said lid with said positioning means improperly disposed.

15. A system according to claim 13 further comprising means serving to yieldingly retain said lid in its closed position, the last named means including a flexible hinge pin extending across the path of said web and carried by said lid, a pivotable member carried on said hinge pin to depend from the lid, said pivotable member being movable between advanced and retracted positions toward and away from said housing, detent means having a first portion carried on said pivotable member and a second portion carried on said pivotable member and a second portion carried on said side walls in position to be engaged by said first portion upon movement of said pivotable member toward said housing, one of said portions having a cam surface thereon to permit said portions to be urged together, the disposition of said portions being such that as they are urged together the pivotable member is drawn downwardly againt the resilience of said hinge pin whereby said hinge pin yieldingly retains said portions in engagement therebetween.

16. A system according to claim 15 in which said pivotable member serves as a partial closure panel across an end of said housing.

17. In a recorder system of the kind wherein a plurality of component parts are employed to provide information on a record material and including an elongate web of record material to be moved along a predetermined path to be recorded thereon the combination comprising a housing having spaced apart confronting side walls and means functioning in the system as a component part of the system and for providing cross-bracing strength therebetween, a lid hinged to said housing and movable between lowered and raised positions with respect to the housing, web-cutting means having portions carried by both said lid and said housing, means in said housing containing a web supply for permitting the web to be withdrawn therefrom with said lid in its raised position and overlaid across said portion carried by said housing, said portions being disposed to be brought into cooperative relation embracing said web therebetween upon closure of said lid to establish the web in threaded relation between the portions of said cutting means.

* * * * *